United States Patent
Park

(10) Patent No.: US 7,420,644 B2
(45) Date of Patent: Sep. 2, 2008

(54) LIQUID CRYSTAL DISPLAY DEVICE AND FABRICATING METHOD THEREOF

(75) Inventor: Kwang Sub Park, Kyoungsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 171 days.

(21) Appl. No.: 10/876,615

(22) Filed: Jun. 28, 2004

(65) Prior Publication Data

US 2005/0122462 A1    Jun. 9, 2005

(30) Foreign Application Priority Data

Dec. 4, 2003    (KR) .................. 10-2003-0087700

(51) Int. Cl.
   *G02F 1/1345*    (2006.01)
(52) U.S. Cl. ........................ 349/152; 349/149
(58) Field of Classification Search .......... 349/149–152
   See application file for complete search history.

(56) References Cited

U.S. PATENT DOCUMENTS

| 5,748,179 | A  | * | 5/1998 | Ito et al. ................. 349/152 |
| 6,172,733 | B1 | * | 1/2001 | Hong et al. ............... 349/152 |
| 6,992,735 | B2 | * | 1/2006 | Kim ....................... 349/58 |

* cited by examiner

*Primary Examiner*—Michael H Caley
(74) *Attorney, Agent, or Firm*—McKenna Long & Aldridge LLP

(57) ABSTRACT

A liquid crystal display device includes a lower pad electrode connected to a signal line of a liquid crystal display panel, one or more insulating layers formed on the lower pad electrode, a plurality of minute holes passing through the one or more insulating layers to expose a portion of the lower pad electrode, one or more main contact holes passing through the one or more insulating layers to expose another portion of the lower pad electrode, and an upper pad electrode electrically connected to the lower pad electrode via the minute holes and the one or more main contact holes. An area of the one or more main contact holes is larger than an area of each of the plurality of minute holes.

9 Claims, 7 Drawing Sheets

LIQUID CRYSTAL DISPLAY DEVICE AND FABRICATING METHOD THEREOF

The present application claims the benefit of Korean Patent Application No. P2003-87700 filed in Korea on Dec. 4, 2003, which is hereby incorporated by reference.

BACKGROUND OF THE INVENTION

1. Field of the Invention

The present invention relates to a liquid crystal display device, and more particularly, to contacts in a liquid crystal display device and a method of fabricating the same.

2. Description of the Related Art

In general, a liquid crystal display (LCD) device controls a light transmittance of liquid crystal cells using an electric field having a dielectric anisotropy, to thereby display a picture. To this end, the LCD device includes a liquid crystal display panel with the liquid crystal cells in an active matrix arrangement, and driving circuits for driving the liquid crystal panel. The liquid crystal display panel includes a common electrode and pixel electrodes to supply the electric field to each of the liquid crystal cells. Usually, each of the pixel electrodes corresponding to a liquid crystal cell is formed on a lower substrate, while the common electrode is integrally formed on the entire surface of an upper substrate. The pixel electrode is connected to a thin film transistor (TFT) that is used as a switching element. The pixel electrode drives the liquid crystal cell jointly with the common electrode, in response to data signals supplied via the TFT. The driving circuit includes a gate driver, a data driver, a timing controller and a power supply. The gate driver drives gate lines of the liquid crystal display panel. The data driver drives the data lines of the liquid crystal display panel. The timing controller controls a driving timing of the gate driver and the data driver. The power supply supplies power signals required for driving the liquid crystal display panel and the driving circuit.

FIG. 1 is a plan view of a liquid crystal display device in accordance with related art. Referring to FIG. 1, a related art liquid crystal display device includes a liquid crystal panel 6; a gate printed circuit board (PCB) 26 and a data PCB 16, a gate tape carrier package (TCP) 8 and a data TCP 12 which are installed between the liquid crystal panel 6 and the gate PCB 26, and the liquid crystal panel 6 and the data PCB 16, respectively, a gate drive integrated circuit (IC) 10 and a data drive IC 14 which are mounted on the gate TCP 8 and the data TCP 12, respectively, a first flexible printed circuit (FPC) 28 that connects the gate PCB 26 and the data PCB 16, a main PCB 20 including the timing controller 22 and the power 24; and a second FPC 18 serving to connect the main PCB 20 and the data PCB 16.

In the liquid crystal panel 6, a liquid crystal cell is arranged in a matrix structure at a pixel region defined between gate lines GL and data lines DL. The liquid crystal panel 6 includes a lower substrate 2 and an upper substrate 4 and is fabricated by injecting liquid crystal material between the lower substrate 2 and the upper substrate 4 and then combining the lower substrate 2 and the upper substrate 4 having the liquid crystal material therebetween. A plurality of gate pads (not shown) is formed at the edge of one side of the lower substrate 2 of the liquid crystal panel 6. A plurality of data pads (not shown) is formed at the edge of a lower portion of the lower substrate 2 of the liquid crystal panel 6.

Each of the gate pads supplies a gate signal from the gate drive IC 10 to the gate lines GL. Also, each of the data pads supplies a data signal from the data drive IC 14 to the data lines DL. The gate pad and the data pad formed on the liquid crystal panel 6 are electrically connected to the gate TCP 8 and the data TCP 12, respectively, by a tape automated bonding (TAB) system.

Each of the gate TCP 8 and the data TCP 12 is made of a polyimide base film on which input and output pads are formed for the connection of input and output parts. The gate drive IC 10 and the data drive 14 are mounted on the gate TCP 8 and the data TCP 12, respectively. The output parts of the gate TCP 8 and the data TCP 12 are connected to the gate pad and the data pad, respectively. The input parts of the gate TCP 8 and the data TCP 12 are connected to the gate PCB 26 and the data PCB 16, respectively.

The gate drive IC 10 is connected to the gate line GL through the gate TCP 8 and the gate pad of the liquid crystal display panel 6. The gate drive IC 10 sequentially supplies a scanning signal having a gate high voltage Vgh to the gate lines GL during a first time interval. Further, the gate drive IC 10 supplies a gate low voltage Vgl to the gate lines GL for a remaining interval excluding the first time interval. To this end, the gate drive IC 10 receives a gate control signal from the timing controller 22 and a power signal from the power 24 on the main PCB 20 via the first FPC 28 and the gate PCB 26.

The data drive IC 14 supplies red, green and blue (R,G,B) data provided from the data PCB 16 to the data lines DL. To this end, the data drive IC 14 receives data control signals, pixel data and power signals from the timing controller 22 and a power signal from the power 24 on the main PCB 20 via the data PCB 16 and the second FPC 18.

FIG. 2 is a detailed plan view of a pad part depicted in FIG. 1. FIG. 3 is a sectional view of the pad part taken along line III-III' as depicted in FIG. 2. Referring to FIGS. 2 and 3, the data pad includes a lower data pad electrode 40 connected to the data line DL and an upper data pad electrode 42 connected, via a contact hole 41, to the lower data pad electrode 40. The upper data pad electrode 42 is electrically connected to an output pad 58 formed on a base film 60 of the data TCP 12 by a conductive ball 52 of an anisotropic conductive film (ACF) 50.

The ACF 50 is attached on the upper data pad electrode 42 of the liquid crystal display panel 6. Also, the output pad 58 of the data TCP 12 is aligned to overlap the lower data pad electrode 40 and then is pressured by a pressure device 62. Then, the conductive ball 52 included in the ACF 50 is electrically connected to the upper data pad electrode 42. Similarly, in the gate pad (not shown), an output pad of the gate TCP 8 is electrically connected to the upper data pad electrode via the conductive ball of the ACF.

The contact hole employed for the electrical connection of the output pad 58 and the upper data pad electrode 40 is shaped as a bucket shape in accordance with the shape of the lower data pad electrode 40. Although the electrical connection of the output pad 58 and the upper data pad electrode 41 is made by forming the contact hole 41, the distance between the output pad 58 and the upper data pad electrode 42 increases because of the bucket shape of the contact hole 41. Thus, the conductive ball 52 in the ACF 50 would not contribute to the connection between the output pad 58 and the upper data pad electrode 42. Only the contact ball 52 located at a region, which excludes the contact hole 41, substantially contributes to the electrical connection between the pads of the data TCP 12 and the liquid crystal display panel 6. Accordingly, the contact area corresponding to the electrical connection between the output pad of the data TCP 12 and the upper data pad electrode 42 decreases. Thus, a contact between these pads deteriorates. Moreover, a defective contact between these pads causes a deterioration in a picture quality of a liquid crystal display device.

SUMMARY OF THE INVENTION

Accordingly, the present invention is directed to a liquid crystal display device and fabricating method thereof that substantially obviate one or more of the problems due to limitations and disadvantages of the related art.

An object of the present invention is to provide a liquid crystal display device with an enhanced contact area between a data pad and an output pad.

Another object of the present invention is to provide a method of fabricating a liquid crystal display device for improving a contact area between a data pad and an output pad.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages, and in accordance with the purpose of the present invention, as embodied and broadly described, the liquid crystal display device includes a lower pad electrode connected to a signal line of a liquid crystal display panel, one or more insulating layers formed on the lower pad electrode, a plurality of minute holes passing through the one or more insulating layers to expose a portion of the lower pad electrode, one or more main contact holes passing through the one or more insulating layers to expose another portion of the lower pad electrode, and an upper pad electrode electrically connected to the lower pad electrode via the minute holes and the one or more main contact holes. An area of each of the one or more main contact holes is larger than an area of each of the plurality of minute holes.

In another aspect, the liquid crystal display device includes a lower pad electrode connected to a signal line of a liquid crystal display panel, an insulating layer formed on the lower pad electrode, a plurality of contact holes passing through the insulating layer to expose a portion of the lower pad electrode, and an upper pad electrode electrically connected to the lower pad electrode via the plurality of contact holes. The plurality of contact holes includes at least two contact holes having different areas.

In another aspect, the method of fabricating a liquid crystal display device includes forming a lower pad electrode connected to a signal line of a liquid crystal display panel on a substrate, forming one or more insulating layers on the lower pad electrode, forming a plurality of minute holes and one or more main contact holes on the insulating layer to expose a portion of the lower pad electrode, forming an upper pad electrode on the minute holes, the one or more main contact holes and the one or more insulating layers, the upper pad electrode being electrically connected to the lower pad electrode via the minute contact holes and the one or more main contact holes, and attaching the upper pad electrode and a tape carrier package through the use of an anisotropic conductive film. An area of the main contact hole is larger than an area of each of the plurality of minute holes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the present invention and together with the description serve to explain the principles of that invention. In the drawings.

DETAILED DESCRIPTION OF THE PREFERRED EMBODIMENTS

Reference will now be made in detail to the preferred embodiments of the present invention, examples of which are illustrated in the accompanying drawing.

Figure 1:
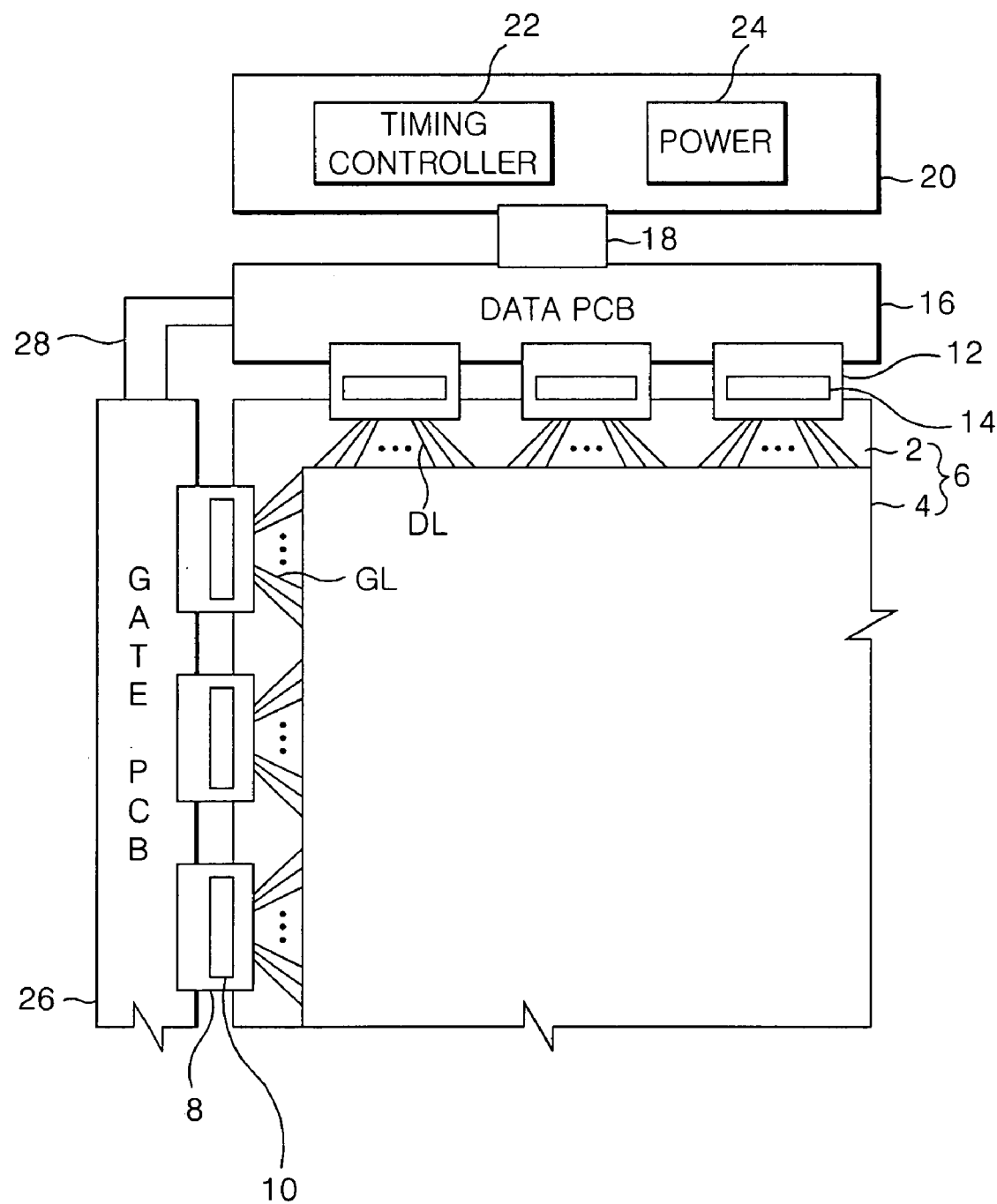
FIG. 1 is a plan view of a liquid crystal display device in accordance with related art.
Figure 2:
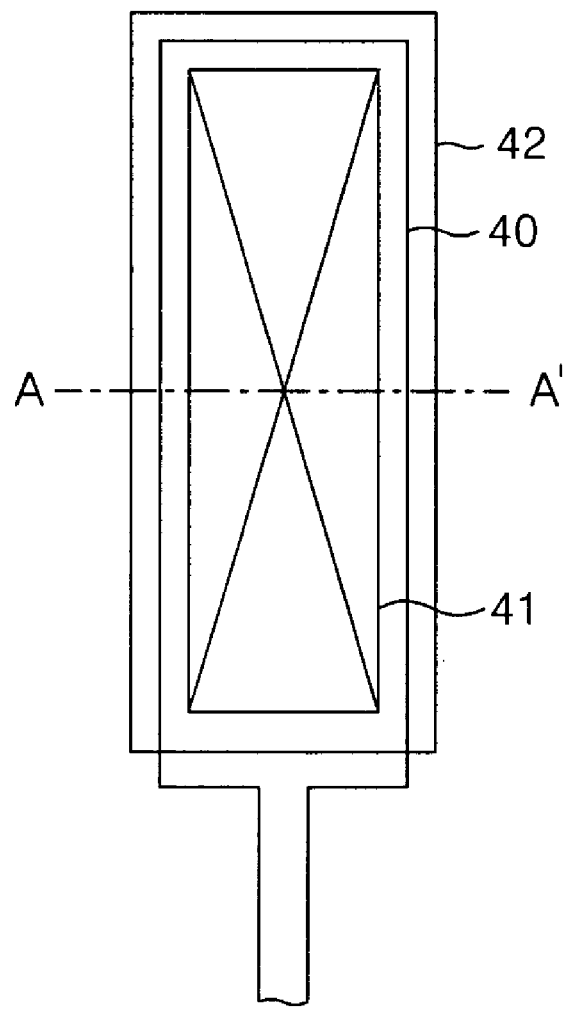
FIG. 2 is a detailed plan view of a pad part depicted in FIG. 1.
Figure 3:
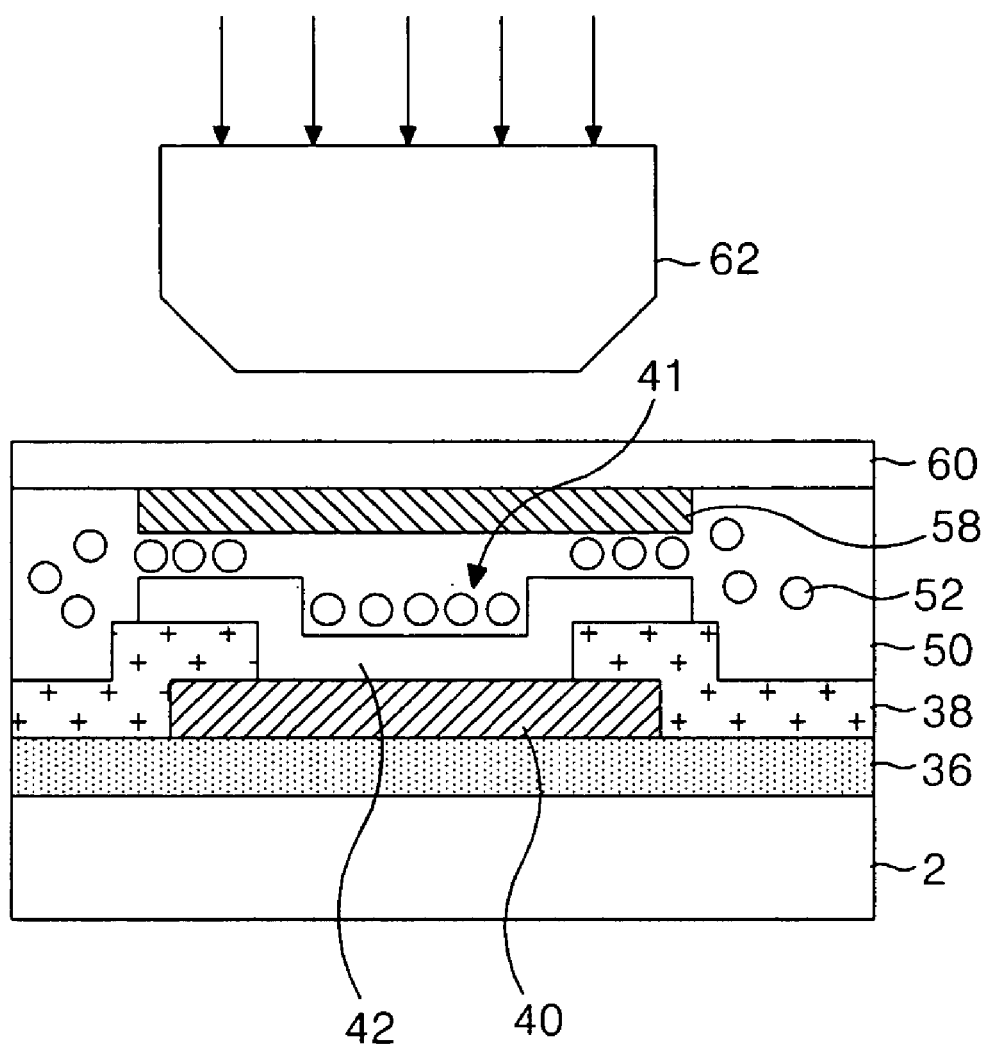
FIG. 3 is a sectional view of the pad part taken along line III-III' as depicted in FIG. 2.
Figure 4:
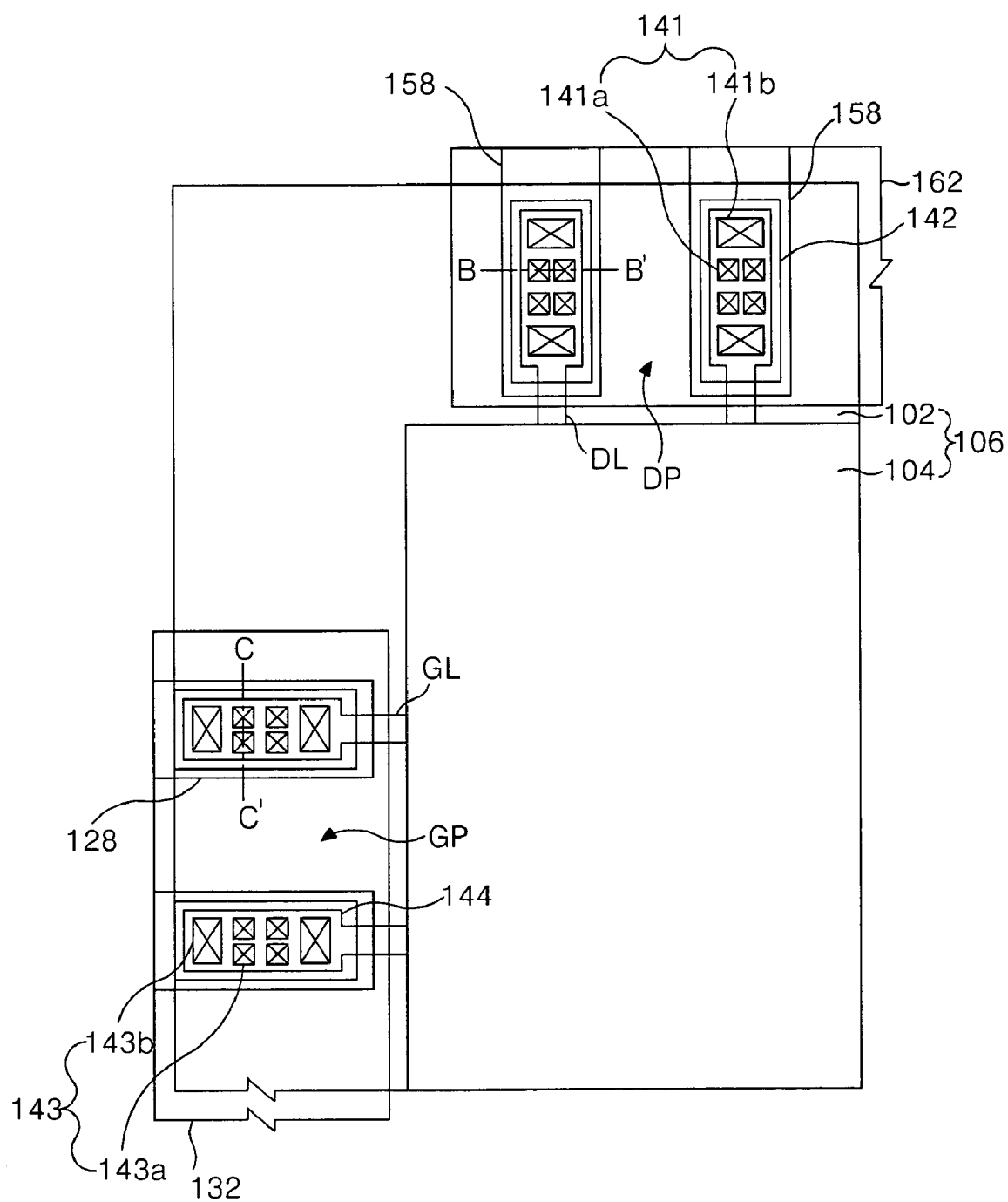
FIG. 4 is a plan view of an exemplary liquid crystal display device according to an embodiment of the present invention.

FIG. 4 is a plan view of an exemplary liquid crystal display device according to an embodiment of the present invention. Referring to FIG. 4, a liquid crystal display device according to the present invention includes a liquid crystal display panel 106, a data TCP 162 and a gate TCP 132. The liquid crystal display panel 106 includes a pad part in which a plurality of minute holes 141a is patterned at an outer region. The data TCP 162 is connected to the liquid crystal display panel 106 and includes a data drive IC mounted thereon. The gate TCP 132 is connected to the liquid crystal display panel 106 and includes a gate drive IC mounted thereon.

The data drive IC is mounted on the data TCP 162. Input pads (not shown) and output pads 158 are formed on the data TCP 162. The input and output pads 158 are electrically connected to the data drive IC. The input pads of the data TCP 162 are electrically connected to output pads of a data PCB. The output pads 158 of the data TCP 162 are electrically connected to data pads DP on a lower substrate. The input pads of the data TCP receive data control signals and pixel data supplied from a timing controller on a main PCB and a power signal supplied from a power supply through the data PCB and then supplies them to the data drive IC. The data drive IC converts pixel data into an analog pixel signal and then supplies the analog pixel signal to data lines DL via the data pad DP connected to the output pad 158 of the data TCP.

The gate drive IC is mounted on the gate TCP 132. Input pads (not shown) and output pads 128 are formed on the data TCP 132. The input and output pads 128 are electrically connected to the gate drive IC. The input pads of the gate TCP are electrically connected to output pads of a gate PCB. The output pads 128 of the gate TCP are electrically connected to gate pads GP on a lower substrate. The input pads of the gate TCP receive gate control signals from the timing controller on the main PCB and the power signal supplied from the power supply through the gate PCB. Then, the input pads of the gate TCP supply the received gate control signals to the gate drive IC.

The liquid crystal display panel 106 includes a lower substrate 102 and an upper substrate 104. The liquid crystal display panel 106 is fabricated by positioning a liquid crystal material between the substrates 102 and 104.

A liquid crystal cell is arranged in a display area of the liquid crystal display panel 106. The liquid crystal cell is independently driven by a thin film transistor. The thin film transistor is formed at each area defined by a crossing of each of the gate lines GL and each of the data lines DL. The thin film transistor supplies the analog pixel signal from the data line DL to the liquid crystal cell in response to a scanning signal from the gate line GL. The gate pad GP, which is connected to the gate line, and the data pad DP, which is connected to the data line Dl, are formed at the outer area of the liquid crystal display panel 106.

Figure 5:
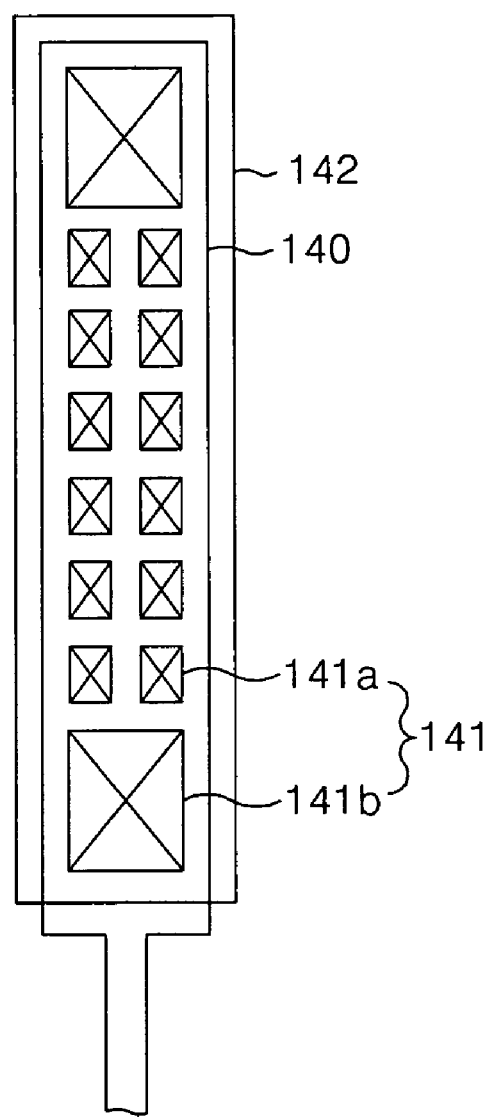
FIG. 5 is an enlarged plan view of the data pad part depicted in FIG. 4.
Figure 6:
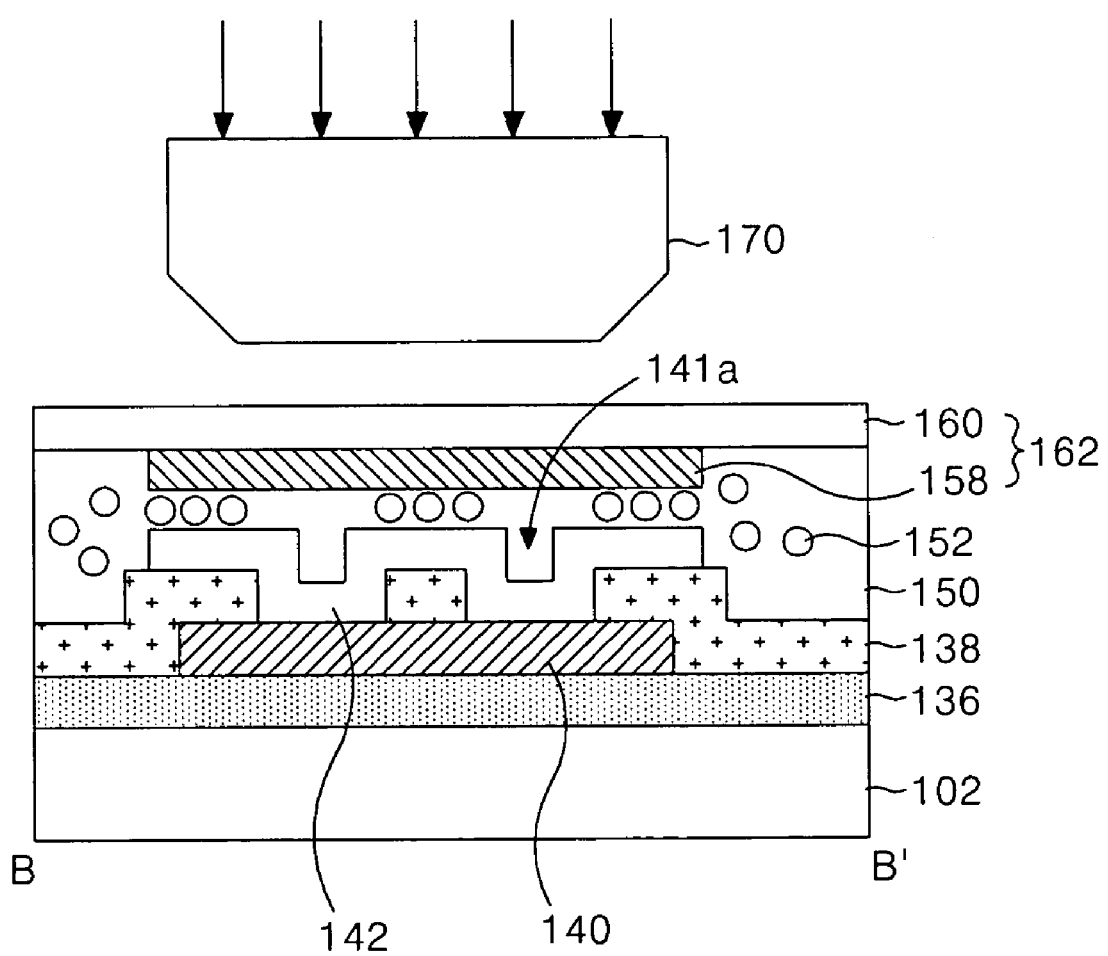
FIG. 6 is a sectional view of the data pad part taken along line VI-VI' depicted in FIG. 4.

FIG. 5 is an enlarged plan view of the data pad part depicted in FIG. 4. FIG. 6 is a sectional view of the data pad part taken along line VI-VI' depicted in FIG. 4. Referring to FIGS. 5 and 6, the data pad DP includes a lower data pad electrode 140 and an upper data pad electrode 142 connected to the lower data pad electrode 140 through a data contact hole 141 passing through a passivation film 138. The lower data pad electrode 140 is connected to the data line DL of the liquid crystal display panel 106. The upper data pad electrode 142 is electrically connected to an output pad 158 formed on a base film 160 of the data TCP 162 by a conductive ball 152 of an anisotropic conductive film (ACF) 150.

The ACF 150 is attached on the upper data pad electrode 142 of the liquid crystal display panel 106. The output pad 158 of the data TCP 162 is aligned to overlap the lower data pad electrode 140. Then, the conductive ball 152 included in the ACF 150 is contacted with the output pad 158 and the upper data pad electrode 142, to create an electrical connection, by pressing the output pad 158 of the data TCP 162 using a pressure device.

The data contact hole 141 includes a plurality of minute holes 141a and a main hole 141b. The minute holes 141a are formed on a middle portion of the data pad DP. The main hole 141b is formed at both ends of the data pad DP and has a width nearly identical to that of the data pad DP. An area of the minute hole 141a is about 10% to 40%, preferably about 20%, of the area of the main hole 141b in consideration of an adhesive strength and a contact resistance between the upper data pad electrode 142 and the lower data pad electrode 140.

If the data contact hole 141 is formed with the plurality of minute holes 141a, the overall area of the holes decreases. Thus, the number of conductive balls 152 of the ACF 150 contacting both the upper data pad electrode 142 and the output pad 158 increases accordingly. Accordingly, it is possible to insure that the area around the minute holes 141a is sufficient for the conductive ball 152 of the ACF 150 to directly contact both the upper data pad electrode 142 and the output pad 158 of the data TCP 162. As a result, the electrical contact between the liquid crystal display panel 106 and the pad of the data TCP 162 is enhanced.

Meanwhile, the main hole 141b is dimensioned larger than the minute holes 141a and has a width identical to that of the data pad DP at both ends of the data contact hole 141. Accordingly, a connection resistance between the upper data pad electrode 142 and the lower data pad electrode 140 is reduced and leads to a smooth electrical connection.

Figure 7:
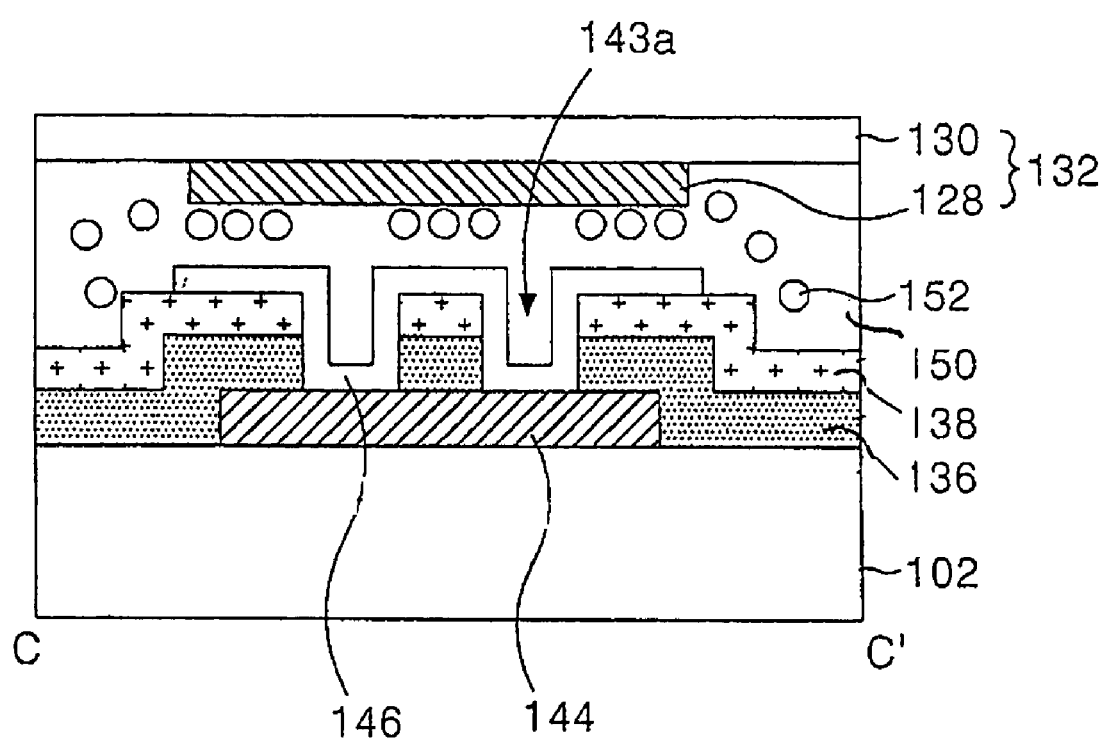
FIG. 7 is a sectional view of an exemplary gate pad part taken along line VII-VII' depicted in FIG. 4.

FIG. 7 is a sectional view of an exemplary gate pad part taken along line VII-VII' depicted in FIG. 4. The gate pad GP has a structure similar to that of the data pad DP and includes a gate contact hole 143 having a plurality of minute holes 143a as depicted in FIG. 7. The gate pad GP includes a lower gate pad electrode 144 and an upper gate pad electrode 146 connected to the lower gate pad electrode 144 via a gate insulating film 136 and a gate contact hole 143 passing through the passivation film 138. The lower gate pad electrode 144 is connected to the gate line GL of the liquid crystal 106.

The gate contact hole 143 includes a plurality of minute holes 143a and a main hole 143b. The minute holes 143a are formed on a middle portion of the gate pad GP. The main hole 143b is formed at both ends of the gate pad GP and has a width nearly identical to that of the gate pad GP. An area of the minute hole 143a is about 10% to 40%, preferably about 20% of the area of main hole 143b in consideration of an adhesive strength and a contact resistance between the upper gate pad electrode 146 and the lower gate pad electrode 144.

If the gate contact hole 143 is formed with the plurality of minute holes 143a, the overall area of the holes decreases. Thus, the number of conductive balls 152 of the ACF 150 contacting both the upper gate pad electrode 146 and the output pad 128 of the gate pad TCP 132 increases accordingly. Thus, it is possible to insure that the area around the minute holes 143a is sufficient for the conductive ball 152 of the ACF 150 to directly contact both the upper gate pad electrode 146 and the output pad 128 of the gate TCP 132. As a result, the contact area between the liquid crystal display panel 106 and the pad of the gate TCP 132 is enhanced.

In embodiments of the present invention, each of the gate insulating film 136 and the passivation film 138 depicted in FIGS. 6 and 7 represents an insulating layer.

A method of fabricating a liquid crystal display device according to an embodiment of the present invention includes the following steps. First, a lower gate pad electrode 144 is formed on a substrate 102. The lower electrode 144 is covered with a gate insulating film 136. Then, a lower data pad electrode 140 is formed on the gate insulating film 136. Subsequently, a passivation film is formed to cover the lower data pad electrode 140 and a minute hole 141a passing through the passivation film 138 and a main hole 141b. Then, an upper data pad electrode 142 is formed. The upper data pad is connected to the lower data pad electrode 140 via the holes 141a and 141b. Further, a minute hole 143a and a main hole are formed. The minute hole 143a passes through the gate insulating film 136 and the passivation film 138. Then, an upper gate pad electrode 146 is formed. The upper gate pad electrode 146 is connected to the lower gate pad electrode 144 via the holes 143a and 143b.

In the present method of fabricating the liquid crystal display device as set forth above, in contrast with the related art method, openings corresponding to the minute holes 141a and 143a and the main holes 141b and 143b are formed on a mask used to pattern the gate insulating film 136 and the passivation film 138 in the data pad part and the gate pad part.

In accordance with exemplary embodiments of the present invention, it is possible to insure a wide contact area of a ACF conductive ball by forming a contact hole of a gate pad part and a data pad part formed at an outer portion of the liquid crystal panel with a plurality of minute holes. Accordingly, it is possible to enhance a contact area between pads and achieve a low resistance electrical connection between the pads.

It will be apparent to those skilled in the art that various modifications and variations can be made in embodiments the present invention without departing from the spirit or scope of the invention. Thus, it is intended that the present invention cover the modifications and variations of this invention provided they come within the scope of the appended claims and their equivalents.

What is claimed is:

1. A liquid crystal display device comprising:
   a lower pad electrode connected to a signal line of a liquid crystal display panel;
   one or more insulating layers formed on the lower pad electrode;
   a first and a second main contact holes passing through the one or more insulating layers to expose both ends of the lower pad electrode;
   a plurality of minute holes passing through the one or more insulating layers to expose the lower pad electrode between the first and the second main contact holes in a plan view; and
   an upper pad electrode electrically connected to the upper portion of the lower pad electrode via the minute holes and the first and the second main contact holes,
   wherein an area of each of the first and the second main contact holes is substantially larger than an area of each of the plurality of minute holes and has a width substantially identical to that of the lower pad electrode.

2. The liquid crystal display device of claim 1, wherein the signal line includes a data line to which a data voltage is supplied.

3. The liquid crystal display device of claim 2, wherein the one or more insulating layers includes a passivation film covering the data line.

4. The liquid crystal display device of claim 2, wherein the signal line includes a gate line crossing the data line and receiving a scanning signal.

5. The liquid crystal display device of claim 4, wherein the one or more insulating layers includes:
   a gate insulating film covering the gate line; and
   a passivation film stacked on the gate insulating film to cover the data line.

6. The liquid crystal display device of claim 1, wherein the area of each of the plurality of minute holes is about 10%~40% of the area of each of the first and the second main contact holes.

7. The liquid crystal display device of claim 1, wherein the area of each of the plurality of minute holes is about 20% of the area of each of the first and the second main contact holes.

8. The liquid crystal display device of claim 1, wherein the upper pad electrode is connected to a tape carrier package by an anisotropic conductive film.

9. A method of fabricating a liquid crystal display device comprising:
   forming a lower pad electrode connected to a signal line of a liquid crystal display panel on a substrate;
   forming one or more insulating layers on the lower pad electrode;
   forming a first and a second main contact holes and a plurality of minute holes in the one or more insulating layers to expose the lower pad electrode at both ends of the lower pad electrode and between the first and the second main contact holes in a plane view, respectively;
   forming an upper pad electrode on the minute holes, the first and the second main contact holes and the one or more insulating layers, the upper pad electrode being electrically connected to the lower pad electrode via the minute holes and the first and the second main contact holes; and
   attaching the upper pad electrode and a tape carrier package through an anisotropic conductive film,
   wherein an area of the first and the second main contact holes is substantially larger than an area of each of the plurality of minute holes and further wherein a main hole has a width substantially identical to that of the lower pad electrode at both ends of the lower pad electrode.

* * * * *